(12) United States Patent
Tsushima et al.

(10) Patent No.: US 7,715,220 B2
(45) Date of Patent: May 11, 2010

(54) MEMORY APPARATUS

(75) Inventors: Tomohito Tsushima, Tokyo (JP); Katsuhisa Aratani, Tokyo (JP)

(73) Assignee: Sony Corporation, Tokyo (JP)

( * ) Notice: Subject to any disclaimer, the term of this patent is extended or adjusted under 35 U.S.C. 154(b) by 94 days.

(21) Appl. No.: 11/757,107

(22) Filed: Jun. 1, 2007

(65) Prior Publication Data

US 2007/0291527 A1 Dec. 20, 2007

(30) Foreign Application Priority Data

Jun. 7, 2006 (JP) ............................ P2006-158868

(51) Int. Cl.
*G11C 11/00* (2006.01)
(52) U.S. Cl. .................. 365/148; 365/185.02; 365/163; 365/154; 365/189.01
(58) Field of Classification Search ................. 365/148, 365/189.01, 163, 185.02, 154
See application file for complete search history.

(56) References Cited

U.S. PATENT DOCUMENTS

| 6,141,241 A * | 10/2000 | Ovshinsky et al. ........... 365/163 |
| 6,888,773 B2 | 5/2005 | Morimoto |
| 2005/0174840 A1* | 8/2005 | Tsushima et al. ...... 365/185.03 |
| 2005/0174854 A1* | 8/2005 | Tsushima et al. ...... 365/185.29 |
| 2006/0067106 A1* | 3/2006 | Mori et al. .................. 365/148 |
| 2008/0205179 A1* | 8/2008 | Markert et al. .............. 365/207 |

FOREIGN PATENT DOCUMENTS

| JP | 2004-185754 | 7/2004 |
| JP | 2005-235360 | 9/2005 |
| WO | 2005/031752 | 4/2005 |

OTHER PUBLICATIONS

Novel Colossal Magnetoresistive Thin Film Nonvolatile Resistance Random Access Memory (RRAM), written by W. W. Zhuang et al., Technical Digest International Electron Devices Meeting, 2002, p. 193.

* cited by examiner

*Primary Examiner*—Pho M Luu
*Assistant Examiner*—Tha-o Bui
(74) *Attorney, Agent, or Firm*—K&L Gates LLP

(57) ABSTRACT

A memory apparatus is provided that includes a storage element configured to store and retain information based on the state of an electric resistance, and a circuit element connected in series to the storage element as a load. In the memory apparatus, a resistance value is set to one of a plurality of different levels by controlling a voltage or a current applied to the circuit element or the storage element upon the writing. The storage element includes levels having low resistance values and levels having high resistance values obtained after erasing, to each of which different information is allocated. One storage element may store information having a ternary value or more. When erasing the information from the levels excluding the level having the lowest resistance value, a level is initially changed to the level having the lowest resistance value, and subsequently changed to that having a higher resistance value.

5 Claims, 5 Drawing Sheets

MEMORY APPARATUS

CROSS REFERENCE TO RELATED APPLICATIONS

The present application is a continuation-in-part to Japanese Patent Application JP 2006-158868 filed in the Japanese Patent Office on Jun. 7, 2006, the entire contents of which being incorporated herein by reference.

BACKGROUND

The present disclosure relates to a memory apparatus in which a memory cell including a storage element capable of storing and retaining information based on a state of electric resistance.

Semiconductor non-volatile memories such as a flash memory are small in size and capable of retaining recorded data even when the power of the apparatus is turned off, and accordingly, the semiconductor non-volatile memories are widely used as recording mediums for recording moving images and sounds.

It is desired to increase recording capacity and increase recording density in non-volatile.

The non-volatile memories having larger recording capacity and higher recording density may include a non-volatile memory capable of multi-valued recording. That is, capable of storing data of 2 bits or more in one memory cell. The non-volatile memory capable of recording 2-bit data indicates a storage element forming a memory cell that can hold information in four recording states or levels.

Examples of a memory having such multi-valued technology include a flash memory or a resistance change type memory capable of recording information based on the change of a resistance value of a storage element.

The resistance change type memory that is capable of recording information by applying a voltage pulse to a storage element is disclosed in "Novel Colossal Magnetoresistive Thin Film Nonvolatile Resistance Random Access Memory (RRAM)", written by W. W. Zhuang et al., Technical Digest "International Electron Devices Meeting", 2002, page 193, for example. The resistance value of the storage element may be changed by changing the number of times to apply the voltage pulse to the storage element to realize multi-valued recording.

However, writing operation of a flash memory is performed by injecting electric charges stepwise into a terminal floating gate. If the flash memory is configured such that the flash memory may carry out multi-valued recording, longer time to realize multi-valued recording may be required as than when perfuming 1-bit recording (single value recording).

Further, when multi-valued recording is carried out using the resistance change type memory, there may also require longer time, because stepwise resistance change to realize multi-valued recording is controlled by varying the number of times to apply the voltage pulse to the terminal. Thus, increase an operation speed may also be difficult.

When recording information in the storage element capable of performing the multi-valued recording, a plurality of bits may be input and electric charges may be injected corresponding to a plurality of input bits or the voltage pulse may be applied the number of times. Thus, recording operations (electric charge injection or the number of times in applying the voltage pulse to the storage element) may preferably be performed corresponding to a relationship between a plurality of input bits and multi-valued information to be recorded may be performed using a simple circuit having excellent area efficiency.

Accordingly, a memory apparatus capable of carrying out multi-valued recording at high speed and including a driving circuit having a simple circuit with high area efficiency is desired.

Japanese Unexamined Patent Publication No. 2005-235360 discloses that a memory apparatus including a memory cell having a storage element and a circuit element such as a MIS (metal-insulator-semiconductor) transistor, and in which a resistance value of the storage element is controlled by controlling a voltage or current applied to the storage element or the circuit element so that multi-valued recording can be performed.

In the memory apparatus having this configuration, when "writing" is defined as an operation to change the resistance value of the storage element from high to low and "erasing" is defined as an operation to change the resistance value of the storage element from low to high, a resistance value obtained after writing (i.e., a state in which the resistance value is low) includes a plurality of levels so that multi-valued recording; that is, three or more values including a resistance value obtained after erasing (i.e., a state in which the resistance value is high) may be recorded.

However, in the memory apparatus having the above-mentioned configuration, when an erasing operation is carried out, the memory apparatus may provide routes for respective levels in order to shift the resistance value stored in the storage element from a plurality of levels of the resistance value obtained after erasing (e.g., three routes for three levels) to a high level so that erase characteristics in the respective routes may be different. Here, "erase characteristics" include a resistance value obtained after erasing, variability of the resistance value obtained after erasing, retention characteristics of recorded information (retention characteristics of resistance value) and the like.

If the resistance value obtained after erasing has large variability, when recorded information is read from the memory apparatus, recorded information cannot accurately be retrieved from the memory apparatus, thereby resulting in a read error.

If a voltage applied to the storage element to erase recorded information is not applied to all the corresponding routes, recorded information will fail to be erased.

Accordingly, it is desired that incompatibility of erase characteristics can be eliminated.

SUMMARY

According to embodiments of the present application there is provided a memory apparatus capable of recording multi-valued data at high speed, and capable of stably recording and reproducing.

A memory apparatus according to an embodiment includes a circuit element configured to store and retain information based on a state of electric resistance that is connected in series to the storage element as a load. In the memory apparatus, on the one hand, writing is defined as an operation in which a state of the storage element having a high resistance value is changed into a state of the storage element having a low resistance value. On the other hand, erasing is defined as an operation in which a state of the storage element having a low resistance value is changed into a state of the storage element having a high resistance value, a resistance value obtained from the written storage element is set to one of a plurality of different levels by controlling a voltage or a current applied to the circuit element or the storage element upon the writing. The storage element includes a plurality of levels having low resistance values and a plurality of levels having high resistance values obtained after erasing, to each of which different information is allocated, one of the respective storage elements of the memory cells may store information having a ternary value or more. In addition, when the information is erased from the plurality of levels having low resistance values excluding the level having the lowest resistance value, a level of the storage element is initially changed to the level having the lowest resistance value, and subsequently changed to the level having a higher resistance value.

According to the storage apparatus of an embodiment, since the circuit element used as a load is connected in series to the storage element to construct the memory cell, when a voltage higher than a write threshold voltage of the storage element is applied to both terminals of the memory cell, the resistance value of the storage element is changed so as to write information in the storage element. The resistance value of the written storage element is set to the state (operation point) determined by the current-to-voltage characteristics (I-V characteristics) of the storage element and the current-to-voltage characteristics (I-V characteristics) of the circuit element, and hence the resistance value may no longer be changed. As a result, the set resistance value of the written storage element may be changed by changing the magnitude of the voltage or current applied to the circuit element or the storage element. Subsequently, in the memory apparatus according to an embodiment, the resistance value of the written storage element is set to a plurality of different levels by controlling a voltage or current applied to the circuit element or the storage element upon writing. The storage element may have different information allocated to a plurality of (N levels; N≧2) levels; one having low resistance values and the other having high resistance values of the erased storage element. Thus, since information can be stored in the storage element having a ternary value or more of each memory cell, the resistance value obtained may be controlled after information is recorded so that the resistance value may be set to a total (N+1) levels including a plurality of low resistance levels (N) and the high resistance levels. As a result, information having (N+1) values or more; that is, information having a ternary value or more can be stored in the storage element.

As described above, multi-valued recording in which information having a ternary value or more can be stored may be carried out while an ordinary storage element can merely store binary data (data of "0" and "1").

As a result, by controlling the voltage or current applied to the circuit element or storage element, information having a ternary value or more may be recorded in the storage element by one application of the voltage pulse without changing the number of applications of the voltage pulse to both terminals of the memory cell. Thus, the pulse width may not have to be controlled and the voltage pulse may not have to be applied to both terminals of the memory cell a number of times.

Accordingly, multi-valued recording can be performed in a short time.

Further, of a plurality of levels having low resistance values, when information is erased from the level excluding the level with the lowest resistance value in the storage element, since the state is shifted to the high resistance state after a level is shifted to the level with the lowest resistance value, the level of the storage element constantly passes the level (level obtained after erasing) having the lowest resistance value in the erase operation process and hence erase characteristics can be constant. As a result, the resistance value obtained after erasing information from the storage element can be approximately constant and variability of the resistance value may be decreased. Therefore, the erase operation can stably be carried out and read errors can be prevented when information is read from the storage element. Accordingly, information can stably be recorded in the storage element and information can stably be read from the storage element.

According to an embodiment, since multi-valued recording can be carried out in a short time, multi-valued recording may be carried out at high speed.

Moreover, multi-valued recording may be achieved by arranging a circuit element in a simple manner such as a memory cell selection active element, a wiring potential control circuit, a variable resistance element or a switching element.

According to an embodiment, multi-valued recording can be carried out at high speed and a memory apparatus capable of carrying out multi-valued recording with a driving circuit having a relatively simple configuration.

Further, according to an embodiment of the present invention, since information can stably be recorded in the memory apparatus and information can stably be read from the memory apparatus, a highly-reliable memory apparatus capable of stable operation can be achieved.

Additional features and advantages are described herein, and will be apparent from, the following Detailed Description and the figures.

DETAILED DESCRIPTION

According to an embodiment, a memory apparatus includes a resistance change type storage element that is used as a memory cell.

Figure 1:
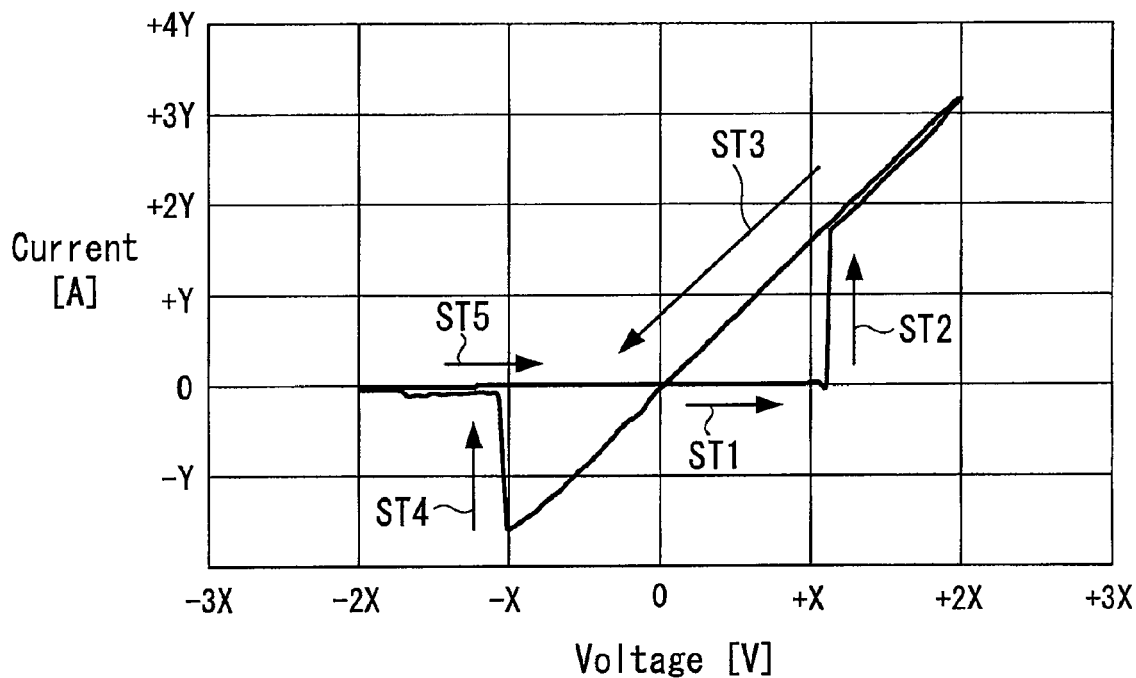
FIG. 1 is a diagram showing changes in voltage-current characteristic of a resistance change type storage element for use in a memory apparatus according to an embodiment.

First, FIG. 1 shows changes in voltage-to-current characteristics of a resistance change type storage element used for a memory apparatus. The resistance change type storage element is configured in the same manner as the resistance change type storage element described in the embodiment of the above-described Japanese Unexamined Patent Publication No. 2005-235360.

Specifically, in the initial state, the resistance change type storage element is high in resistance value and hence an electric current is difficult to flow through the resistance change type storage element (i.e., the resistance change type storage element is placed in the state shown by ST1 in FIG. 1). However, when a write threshold voltage (+1.1X [V] in FIG. 1, for example, more than several 100s of millivolts (mV)) is applied to the resistance change type storage element, an electric current flows through the resistance change type storage element and a resistance value is lowered (in the state shown by ST2 in FIG. 1). The storage element changes to an ohmic characteristic (in the state shown by ST3 in FIG. 1) so that an electric current can flow through the storage element in proportion to a voltage.

When the applied voltage is returned to 0 V, the storage element can retain that resistance value (low resistance value).

Next, when a negative voltage is applied to the storage element and the voltage is increasingly applied, an electric current is decreased (state shown by ST4 in FIG. 1) at an erase threshold voltage (−1.1X[V] in FIG. 1, for example, several 100s of millivolts (mV)) and the storage element is changed to the high resistance state similar to the initial state. Thereafter, even when the voltage is returned to 0 V, the storage element can retain that resistance value (high resistance value) (ST5).

It should be noted that, while the range of the applied voltage falls between −2X and +2X in FIG. 1, the storage element will scarcely change in the resistance value even when the voltage applied exceeds +2X.

Since the resistance change type storage element has the voltage-to-current characteristics, this resistance change type storage element can be used as the non-volatile memory capable of recording 1 bit information similar to the related-art resistance change type storage element. The resistance change type storage element alone may form a memory cell of a memory apparatus.

As an example of the resistance change type storage element having the I-V characteristics (i.e., voltage-to-current characteristics) shown in FIG. 1, a storage element having a storage layer formed of a thin film such as a rare earth oxide film sandwiched between a first electrode and a second electrode (e.g., between a lower electrode and an upper electrode) may be given.

In the storage element having this configuration, the rare earth oxide film may contain metals susceptible to ionization, such as Cu (copper), Ag (silver) or Zn (zinc).

Figure 2:
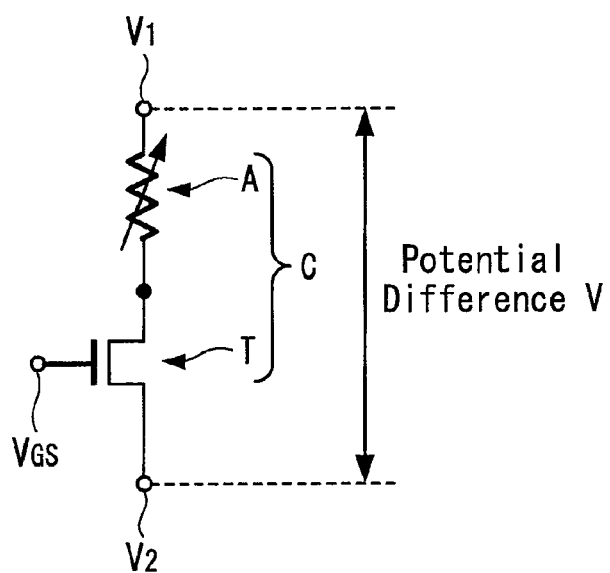
FIG. 2 is a circuit diagram of a memory cell configured using a resistance change type storage element in a memory apparatus according to an embodiment.

According to any embodiment, in particular, a MIS (metal-insulator-semiconductor) transistor is employed as an active element to control access to this resistance change type storage element. FIG. 2 is a circuit diagram showing a memory cell formed of the resistance change type storage element. As shown in FIG. 2, a MIS transistor T is connected in series to a resistance change type storage element A to form a memory cell C of a memory apparatus. The MIS transistor T may serve as a load to the resistance change type storage element A.

Specifically, as shown in FIG. 2, a terminal voltage V1 is applied to the terminal located opposite side of the terminal connected to the MIS transistor T of the resistance change type storage element A. A terminal voltage V2 is applied to the terminal located opposite side of the terminal connected to the MIS transistor T of the resistance change type storage element A. A gate voltage $V_{GS}$ is applied to the gate of the MIS transistor T.

When the terminal voltages V1 and V2 are applied to respective terminals of the resistance change type storage element A forming the memory cell C and the MIS transistor T, a potential difference V(=|V2−V1|) is generated between the two terminals.

An ON-state resistance value of the MIS transistor T may preferably be lower than a high resistance value of the resistance change type storage element A, and more preferably be as sufficiently lower than the high resistance value of the resistance change type storage element A, indicating a fraction of the high resistance value or lower.

If the ON-state resistance value of the MIS transistor T is high, most of the potential difference applied between the terminals is applied to the MIS transistor T so that electric power will be lost, and hence the applied voltage cannot be efficiently used to change the resistance of the storage element A.

Figure 3:
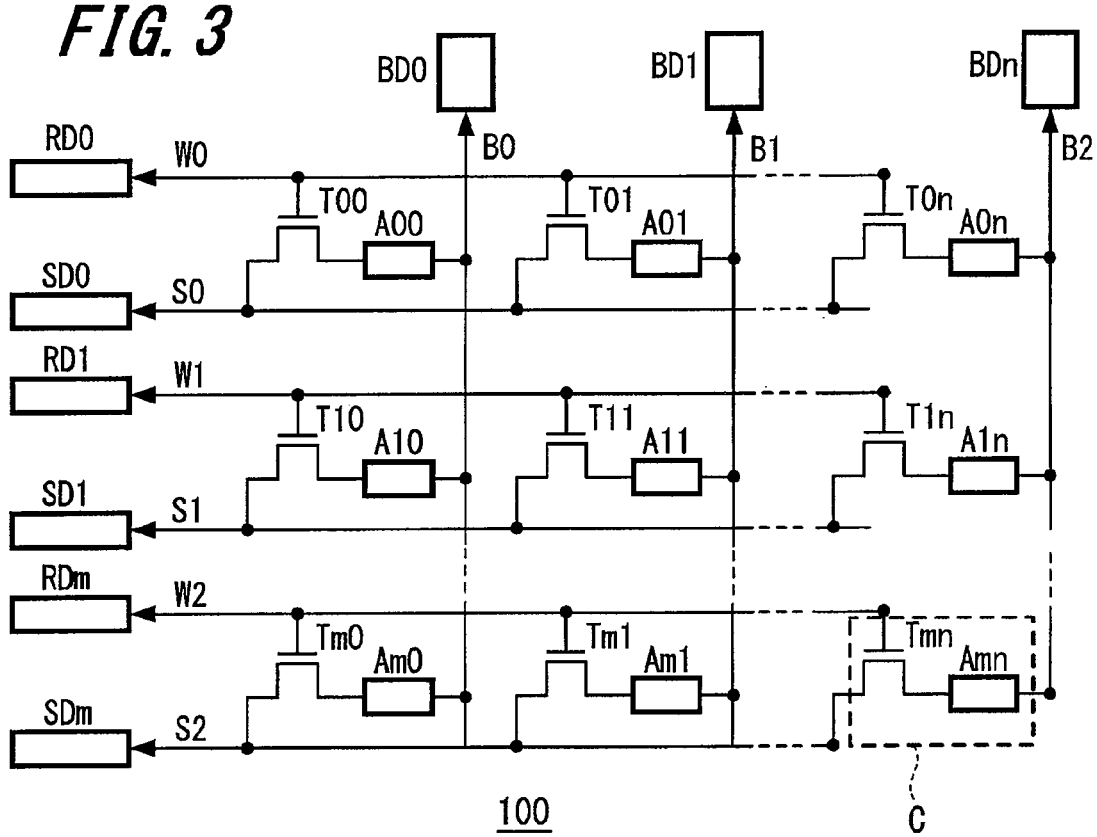
FIG. 3 is an electric circuit diagram showing a memory apparatus according to an embodiment.

Next, FIG. 3 shows an electric circuit diagram of the memory apparatus according to the embodiment. The electric circuit diagram shown in FIG. 3 includes voltage control circuits that are used to apply the respective voltages (V1, V2 and $V_{GS}$) shown in FIG. 2.

A memory apparatus 100, includes memory cells C of (m+1) rows×(n+1) columns arrayed in an XY-matrix fashion. The memory cell C is formed such that one end of the resistance change type storage element is connected to one end (hereinafter called "drain") of the transistor T as shown in FIG. 2. The gates of the transistors T (T00 to Tmin) are connected to word lines W (W0 to Wm). The other ends (sources) of the resistance change type storage element A are connected to bit lines B (B0 to Bn). The other ends (sources) of the transistor T are connected to source lines S(S0 to Sn). Further, the bit lines B (B0 to Bn) are connected to bit decoders BD (BD0 to BDn) used as voltage control circuits thereof. The word lines W (W0 to Wm) are connected to row decoders RD (RD0 to RDm) used as voltage control circuits thereof. The source lines S(S0 to Sm) are connected to source decoders SD (SD0 to SDm) used as voltage control circuits thereof.

Information can be recorded in the memory apparatus 100 having the above-mentioned configuration as follows:

the row decoder RD applies the gate voltage $V_{GS}$ to the word line W corresponding to the memory cell C in which information is to be recorded to turn ON the gate of the MIS transistor T; and the bit decoder BD and the source decoder SD apply the terminal voltages V1 and V2 shown in FIG. 2 to the bit line B and the source line S corresponding to that memory cell C, by which the voltage V can be applied to the resistance change type storage element A and the MIS transistor T within the memory cell C.

When the voltage V is applied to the resistance change type storage element A and the MIS transistor T as described above, if the voltage across both terminals of the resistance change type storage element A becomes higher than a write threshold voltage of the aforementioned resistance change type storage element A, the resistance value of the resistance change type storage element A is lowered and changed from the high resistance state to the low resistance state. Consequently, information can be recorded (hereinafter called "writing") on the resistance change type storage element A. In the state in which the resistance value of the resistance change type storage element A is placed in the low resistance state, when the gate of the MIS transistor T is turned ON and the voltage V of polarity opposite to that of the voltage applied upon writing is applied to the resistance change type storage element A and the MIS transistor T within the memory cell C, if the voltage applied to both terminals of the resistance change type storage element A is larger than the aforementioned erase threshold voltage of the resistance change type storage element A, the resistance value of the resistance change type storage element A is increased from the low resistance state and changed to the high resistance state. As a result, information can be recorded (hereinafter called "erasing") on the resistance change type storage element A.

It should be noted that, since the word lines W are used by sharing between the memory cells C of the respective rows, the gates of the MIS transistors T are turned ON in all memory cells C of the same row. Accordingly, when information is recorded on only part of the memory cells C of a memory cell C group of the same row, for example, with respect to other memory cells C in which information is not recorded, the potential of the bit line B is set to be the same as that of the source line S or a potential difference between the bit line B and the source line S is set so as to become sufficiently smaller than the threshold voltage (write threshold voltage or erase threshold voltage) of the resistance change type storage element A, thereby preventing information from being recorded on the resistance change type storage element A.

Next, an outline of a manner in which resistance values are changed when voltages are applied to both ends of the memory cell C is described.

The voltage V applied to both terminals of the memory cell C is divided into voltages of the storage element A and the MIS transistor T. Simultaneously, if the ON-state resistance value of the MIS transistor T is sufficiently lower than the high resistance value of the storage element A as mentioned hereinbefore, then when the resistance value of the storage element A is high, most of the applied voltage is applied to both terminals of the storage element A. Specifically, a voltage VA applied to both terminals of the storage element A is substantially expressed as an equality of VA=V.

Here, if the applied voltage V is larger than a threshold voltage Vth of the storage element A (V>Vth), the recording operation is started and a resistance value R1 of the storage element A is decreased. The voltage VA applied to both terminals of the storage element A is decreased as the resistance value R1 of this storage element A is lowered.

Then, when the voltage VA applied to both terminals of the storage element A is decreased to a certain voltage Vmin ($\cong$Vth), the decrease of the resistance value R1 of the storage element A is stopped. As a result, the voltage VA applied to both terminals of the storage element A is stopped at the voltage Vmin. That is, when the voltage VA applied to both terminals of the storage element A decreases in accordance with the decrease of the resistance value R1 of the storage element A, a relationship between the electric current I flowing through the storage element A and the voltage VA applied to both terminals of the storage element A gradually approaches the I-V characteristics of the storage element A. When the relationship reaches the I-V characteristics of the storage element A, no more voltage VA may change. More specifically, although the voltage VA applied to both terminals of the storage element A may be increased in order to further decrease the resistance value R1 of the storage element A after the above-mentioned relationship reached the I-V characteristics of the storage element A. If this voltage VA is increased, the electric current I flowing through the storage element A is increased and the same electric current I flows through the MIS transistor T connected in series to the storage element A with the result that a voltage (V-VA) across the MIS transistor T also is increased in response to the increase of the electric current I. However, since the voltage V applied to the memory cell C is constant and the voltages (VA, V-VA) applied to both terminals of the storage element A and the MIS transistor T divide this applied voltage V, both of the voltages VA and V-VA may not be increased. Thus, in the state in which the above-mentioned relationship achieves the I-V characteristics of the storage element A, the resistance value R1 of the storage element A is stopped from being lowered and the voltages (VA, V-VA) applied to both terminals of the storage element A and the MIS transistor T.

This state will hereinafter be referred to as an "operation point" of the memory cell C. In the memory cell C of the memory apparatus 100 according to the embodiment of the present invention, information recording operation (write operation) is stopped at this operation point. Voltages applied to both terminals of the respective elements A and T and an electric current flowing through the memory cell C at this operation point may be calculated based on the I-V characteristics of the storage element A and the I-V characteristics of the MIS transistor T. Specifically, when the I-V characteristics (voltage-to-current changes) of the resistance change type storage element A are plotted using the 0 point as an origin and the I-V characteristics (voltage-to-current changes) of the MIS transistor T are plotted using the V side as an origin, intersection points of lines of these I-V characteristics (voltage-to-current changes) become operation points. By contrast, when the I-V characteristics (voltage-to-current characteristics) of the MIS transistor T are plotted using the 0 point as an origin and the I-V characteristics (voltage-to-current characteristics) of the resistance change type storage element A are plotted using the V side as an origin, operation points may be calculated similarly.

Next, when information is recorded on (erased from) the storage element A with the applied voltage V with opposite polarity, since the resistance value of the storage element A is low, the applied voltage V is set to such that the voltage VA applied to both terminals of the storage element A may become larger than the erase threshold voltage of the storage element A. If the voltage VA applied to both terminals of the storage element A is larger than the erase threshold voltage of the storage element A, recording (erasing) of information is started and the resistance value of the storage element A is gradually increased. In accordance with the increase of the resistance value of the storage element A, the divided voltage of the storage element A. That is, the voltage VA applied to both terminals of the storage element A also increases so that the resistance value of the storage element A is further increased. When the resistance value of the storage element A is increased to some extent (high), no more increase is obtained in the resistance value so that information recording operation (erase operation) is stopped. Voltages applied to both terminals of the two elements A and T and an electric current flowing through the memory cell C in this state can also be calculated based on the I-V characteristics of the storage element A and the I-V characteristics of the MIS transistor T similar to the above-mentioned operation points.

Information can be recorded on, or written in and erased from the storage element A of the memory cell C by applying the voltage V to both terminals of the memory cell C.

Because information is recorded using the two states of the state in which the resistance value of the storage element A is high and the state in which the resistance value of the storage element A is low in the description of the above-mentioned information recording, information of binary (1 bit) information may be recorded. In the memory apparatus according to the embodiment, multi-valued information greater than ternary or quaternary (2 bits) information can be recorded by further elaborating this technology. Multi-valued recording in the embodiment will be described hereinafter.

In the MIS transistor T, in accordance with the magnitude of the gate voltage $V_{GS}$ applied to the gate thereof, the ON-state resistance is changed and the I-V characteristics are also changed. Therefore, the gate voltage $V_{GS}$ of the MIS transistor T of the memory cell C is varied in order to change the I-V characteristics of the MIS transistor T, and hence, the positions of the operation points can be changed.

Figure 4:
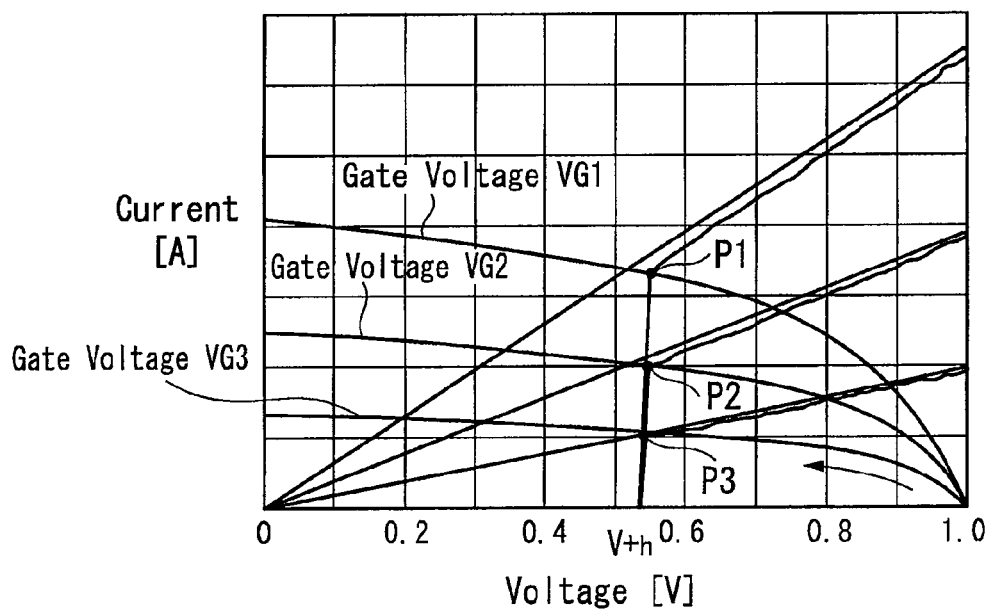
FIG. 4 is an explanatory diagram illustrating how operation points are changed when gate voltages of the MIS transistor shown in FIG. 2 are changed.

Specifically, as shown in FIG. 4, when the gate voltage $V_{GS}$ of the MIS transistor T are varied as VG1, VG2 and VG3 (VG1>VG2>VG3), the I-V characteristics of the MIS transistor T are changed. Since an electric current sufficiently flows to decrease the ON-state resistance as the gate voltage $V_{GS}$ of the MIS transistor T is increased, the operation points become different as shown by P1, P2 and P3 and hence resistance values of the storage element A in these operation points may be different.

When the respective operation points P1, P2, and P3 are allocated to "11", "10", and "01", respectively, and a high resistance value state (state obtained before writing and after erasing) is allocated to "00", 2-bit information in the storage element A may be stored.

In this manner, multi-valued recording may be performed by allocating a plurality of bits of information to resistance values of the element in which information is written.

In practice, MIS transistors T of each memory cell C may have slightly different characteristics in the memory apparatus. In addition to the operation points P1, P2, and P3 shown in FIG. 4, ranges of a certain width (ranges of resistance values of the storage element A) located near the operation points P1, P2, and P3 are allocated to respective information (e.g., "01", "10" and "11".

For example, the case in which the resistance value of the storage element A is less than 3 k Ω is allocated to "11" of 2-bit information, the case in which the resistance value of the storage element A falls within a range of from 3 k Ω to 6 k Ω is allocated to "10", the case in which the resistance value of the storage element A falls within a range of from 6 k Ω to 9 k Ω is allocated to "01", and the case in which the resistance value of the storage element A is greater than 9 k Ω is allocated to "00".

Similarly, 3-bit information (octet information) and 4-bit information (hexadecimal information) may be recorded by subdividing the range of the resistance value.

When information is read from the storage element A on which multi-valued recording is carried out as described above, a read electric current is caused to flow through the memory cell C. Since the electric current flows through the memory cell C in proportion to the resistance value of the storage element A, contents of information may be detected by detecting the resistance value of the storage element A.

However, the resistance value of the storage element A may have to be prevented from being lowered when information is read from the storage element A.

Therefore, when information is read from the storage element A, a relatively high voltage, for example, power source voltage $V_{DD}$ is applied to the gate of the MIS transistor T. Consequently, since the ON-state resistance of the MIS transistor T is decreased, the voltage VA applied to both terminals of the storage element A is also decreased when a read electric current flows through the memory cell C, and hence the resistance value of the storage element A can be prevented from being lowered. In addition, although the voltage applied to both terminals of the memory cell C upon reading become smaller than the applied voltage to both terminals of the memory cell C that is used when an operation point corresponding to recording of information is recorded, the above-mentioned method of applying the power source voltage $V_{DD}$ to the gate of the MIS transistor T is excellent in view of controlling a voltage with ease.

When the resistance value of the storage element A is changed from the low resistance state to the high resistance state. That is, when information is erased from the storage element A, the gate voltage $V_{GS}$ of the MIS transistor T may preferably be a relatively high voltage such as the power source voltage $V_{DD}$. Consequently, since the ON-state resistance of the MIS transistor T is decreased without increasing the voltage V applied to both terminals of the memory cell C, the voltage VA applied to both terminals of the storage element A may be increased up to the erase threshold value or more.

Accordingly, since information can be erased from the storage element A by a relatively small applied voltage V, the voltage V applied to the memory cell for erasing information from the storage element A may be decreased and loads imposed upon wirings and elements may be decreased.

Figure 5:
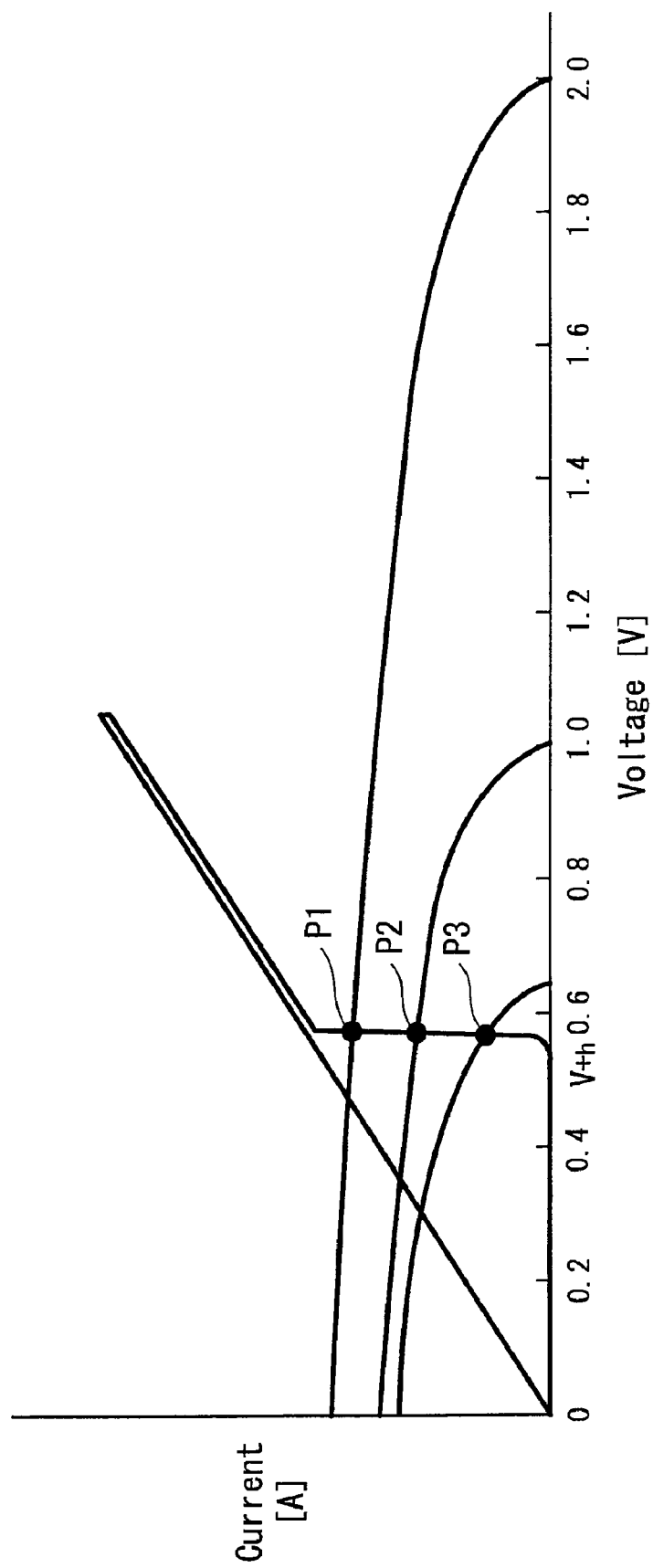
FIG. 5 is an explanatory diagram illustrating how operation points are changed when voltages applied to both terminals of the memory cell shown in FIG. 2 are changed.

It should be noted that operation points can be changed similarly when the voltage V applied to both terminals of the memory cell C is changed as shown in FIG. 5. Thus, multi-valued recording can be performed. In FIG. 5, operations points are varied to P1, P2 and P3 by changing the voltage V applied to both terminals of the memory cell C as 2.0V, 1.0V and 0.65V.

Further, both of the gate voltage $V_{GS}$ of the MIS transistor T and the voltage V applied to both terminals of the memory cell C may be changed. Multi-valued recording may be performed in this manner, and is suitable for the case in which the voltage V applied to both terminals of the memory cell C may be changed considerably (with a wider range).

It should also be noted that, since the storage element A has the I-V characteristics shown in FIG. 1, the resistance value of the storage element A is decreased by changing the gate voltage $V_{GS}$ or the voltage V applied to both terminals of the memory cell C in the direction in which the resistance value of the storage element A is decreased. Thus, according to the embodiment, the operation points can mutually be changed directly, for example, when the operation point is changed from P2 to P1 in FIG. 4.

In contrast, in the direction in which the resistance value of the storage element A is increased (e.g., when the operation point is changed from P1 to P4 in FIG. 4), even when the gate voltage $V_{GS}$ or the voltage V applied to both terminals of the memory cell C is changed, the resistance value of the storage element A is not increased so that the operation points may not mutually be changed directly. Thus, the storage element A is changed from the low resistance state (ohmic characteristics) to the high resistance state with application of a voltage of an opposite polarity at one time, and the storage element A is changed to a desired resistance value at another time. In this case, while the resistance value may be changed in two stages, as compared with the storage apparatus having the configuration in which the resistance value is prescribed by the number of pulses, information may be recorded in a sufficiently short time.

However, three routes may be provided for reaching the resistance values obtained after erasing (hereinafter referred to as an "erase levels") from three resistance values (hereinafter referred to as "write levels") corresponding to the operation points P1, P2, and P3. As mentioned hereinbefore, the storage elements A are different in erase characteristics (resistance values, variability of resistance values, retaining characteristics of recorded information, etc.). Thus, according to the embodiment, in order to eliminate incompatibility of erase characteristics between the three routes, since information can be overwritten in the resistance change type storage element forming the memory cell, the resistance value of the storage element A may constantly pass the write level in which the resistance value is lowest when the resistance value of the storage element A is changed to the erase level. Specifically, if a relationship between the high resistance value and the low resistance value satisfies the following condition: write level 1 (operation point P1)<write level 2 (operation point 2)<write level 3 (operation point P3)<erase level; and if the resistance value is changed to the erase level, the resistance value may constantly pass the write level 1 (operation point P1). For example, when the write level 2 (operation point P2) is changed to the erase level, the resistance value is changed to the write level 2 (operation point P2), the write level 1 (operation point P1) and the erase level in that order.

As a result, when the resistance value is changed in the direction in which the resistance value of the storage element A is increased. That is, when the resistance value is changed from the write level 2 (operation point P2) to the write level 3 (operation point P3), the resistance value is changed in three stages from the write level 2 (operation point P2), the write level 1 (operation point P1), the erase level and the write level 3 (operation point P3), in that order.

As described above, when the resistance value is changed to the erase level, the resistance value may constantly pass the write level in which the resistance value is lowest so that the erase characteristics of the process become constant. Thus, the erase level may become approximately constant and variability of the erase level may considerably be reduced.

In the memory apparatus 100 according to the embodiment, the resistance change type storage element A and the MIS transistor T are connected in series to construct the memory cell C, the gate voltage $V_{GS}$ of the MIS transistor T or the voltage V applied to both terminals of the memory cell C is changed in order to change the operation points to control the resistance value obtained after information is recorded (written or erased) in the storage element A so that the above resistance value is changed into a plurality of levels (points or ranges). Accordingly, information ternary values or above can be recorded in the storage element A. That is, multi-valued recording can be carried out.

Then, in the memory apparatus according to the embodiment, since the resistance value obtained in the storage element A after information is recorded may be changed y changing the gate voltage $V_{GS}$ of the MIS transistor T or the voltage V applied to both terminals of the memory cell C, when multi-valued recording is carried out, voltage pulse/electric current pulse of one clock are sufficient and a pulse width may not have to be controlled, and a pulse may not have to be applied a number of times.

As a result, multi-valued recording may be performed in a short time.

In the memory apparatus according to the embodiment, since the access MIS transistor T provided within the memory cell C to select the memory cell C is used as the circuit element in order to control the operation points of the memory cell C, multi-valued information may be recorded without adding further circuit elements into the memory cell C. That is, according to the memory apparatus of the embodiment, multi-valued recording may be achieved by having the simple configuration.

Further, in the memory apparatus according to an embodiment, as shown in FIG. 3, the shared word line W is connected to the gates of the MIS transistors T of the memory cells C of the respective rows and this word line W is connected to the row decoder RD.

Thus, if the circuit for controlling electric potential of the word line W is connected to the row decoder RD or the circuit for controlling electric potential of the word line W is installed in the row decoder RD, the gate voltage $V_{GS}$ of the MIS transistor T of the memory cell C may be controlled with the simple configuration. Then, as mentioned hereinbefore, the I-V characteristics and the ON-state resistance of the MIS transistor T can be changed by varying the gate voltage $V_{GS}$ of the MIS transistor T of the memory cell C, whereby the operation points can be varied and multi-valued recording can be carried out. That is, in the memory apparatus according to the embodiment, the memory apparatus with the simple configuration may carry out multi-valued recording by controlling the gate voltage $V_{GS}$ of the MIS transistor T of the memory cell C.

Since the circuit for controlling electric potential of the word line W is connected to the row decoder RD, the electric potential of the word line W will be constant, and hence information can collectively be retrieved from the memory cells in the same row.

Figure 6A:
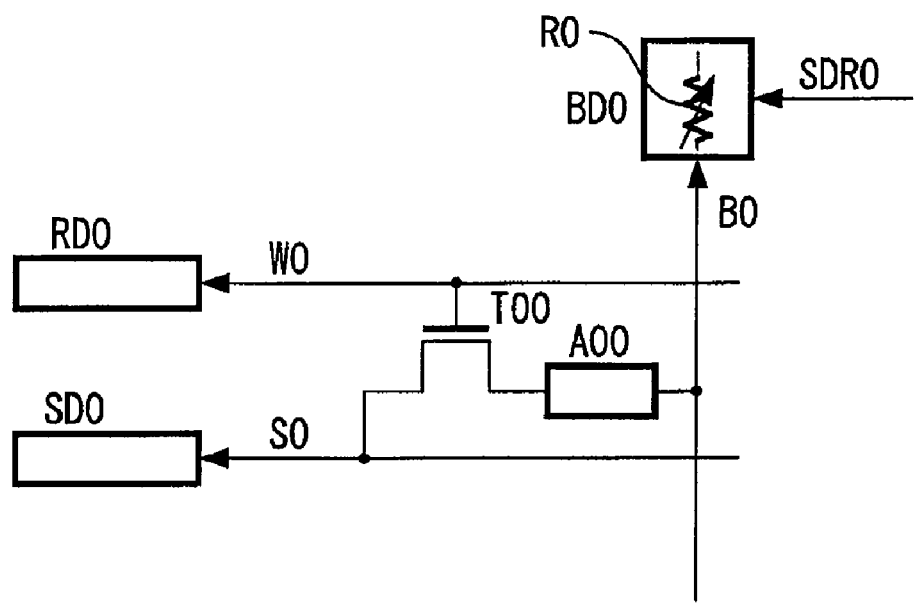
FIG. 6A is an electric circuit diagram of a memory apparatus when controlling a resistance value of a bit decoder.

As already shown in FIG. 5, in order to change the voltage V applied to both terminals of the memory cell C, a decoder resistance control signal SDR0 may be supplied to the bit decoder BD0 and the resistance value of the variable resistance element R0 or the switching element within the bit decoder BD0 may be controlled as FIG. 6A shows an electric circuit diagram. The variable resistance element R0 or the switching element within the bit decoder BD0 may be load resistance against a storage element A00 similar to a MIS transistor T00. Since the bit decoder BD0 generally includes the variable resistance element R0 or the switching element, the voltage V applied to both terminals of the memory cell C may be changed by having the simple configuration without adding a new configuration. The voltage V applied to both terminals of the memory cell C can be similarly controlled by connecting a circuit for controlling electric potential of a source line S to a source decoder SD to select a specific source line S from the source lines S both connected to the memory cells C in the row directions or by controlling the resistance value of the variable resistance element or the switching element provided within the source decoder SD.

Figure 6B:
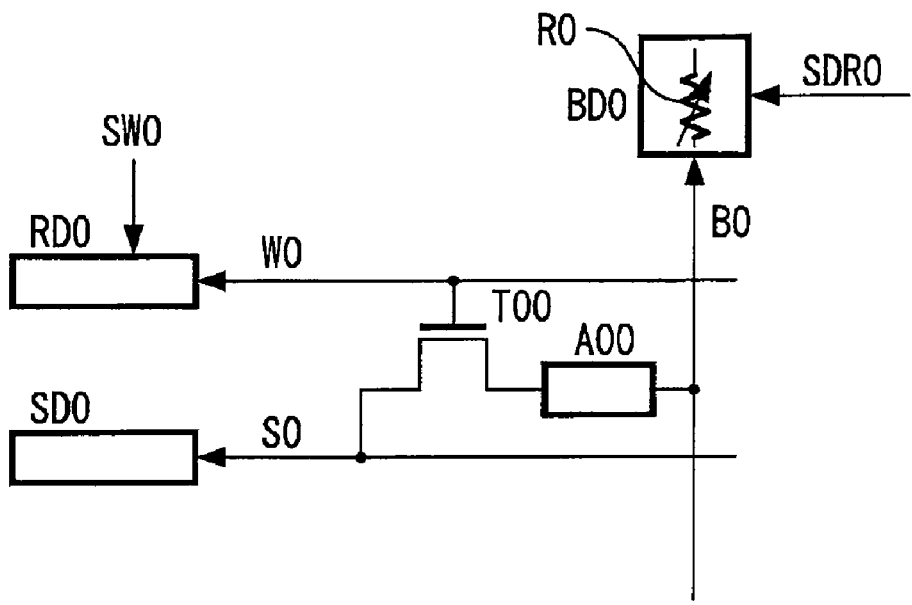
FIG. 6B is an electric circuit diagram of a memory apparatus when controlling a resistance value of a bit decoder and electric potential of a word line.

When the gate voltage $V_{GS}$ of the MIS transistor T and the voltage V applied to both terminals of the memory cell C are both changed, as shown in FIG. 6B illustrating an electric circuit diagram, the decoder resistance control signal SDR0 may be supplied to the bit decoder BD0 similar to the case shown in FIG. 6A and a signal SW0 for controlling electric potential of the word line W0 may be supplied from a circuit (not shown) connected to the row decoder RD0 to control electric potential of the word line W0. As a result, the gate voltage $V_{GS}$ of the MIS transistor T may be controlled. Alternatively, the row decoder RD0 may incorporate a circuit for controlling electric potential of the word line W therein. While one memory cell is shown in each of the electric circuit diagrams of FIGS. 6A and 6B to simplify the drawings, memories in other rows and columns can also be formed in the same manner.

Thus, according to the embodiment, the memory apparatus having simple configuration and capable of carrying out multi-valued recording may be achieved.

Further, according to the memory apparatus 100 of the embodiment, when the level is changed into the erase level; that is, when the erase operation is carried out; writing is carried out via the write level with the lowest resistance value so that the erase characteristic of the erase process may be constant. Variability of the erase level may be drastically suppressed by retaining the erase level approximately constant.

Consequently, since the erase operation and the information reading operation can stably be carried out, the highly-reliable memory apparatus 100 capable of stable operation may be produced.

Here, the memory apparatus capable of carrying out multi-valued recording that may have excellent erase characteristics after information is written via the write level with the lowest resistance value will be described with reference to specific examples.

FIG. 2 shows the memory apparatus including a large number of the memory cells C depicting a circuit configuration. The memory apparatus was actually fabricated, and writing and erasing were repeated with this memory apparatus. After the gate voltage $V_{GS}$ of the transistor T is maintained to have a constant value and information is repeatedly written and erased $10^6$ (one million times) times in the memory apparatus, resistance values obtained after writing information and resistance values obtained after erasing information from storage elements of each memory cell C of a large number of memory cells C were measured. The respective measurements were carried out while the gate voltage $V_{GS}$ of the transistor T upon writing was changed with three values; 0.7 V, 0.9 V, and 1.5 V. A write level obtained when $V_{GS}$=0.7 V was set to "write level 3", a write level obtained when $V_{GS}$=0.9 V was set to "write level 2", a write level obtained when $V_{GS}$=1.5V was set to "write level 1", and thus three write levels were set. A relationship between the resistance values of the respective levels can satisfy an inequality expressed as write level 1<write level 2<write level 3<erase level. It should be noted that the gate voltage $V_{GS}$ of the transistor T upon erasing was set to 1.8V which was same as the power source voltage in any case.

Figure 7:
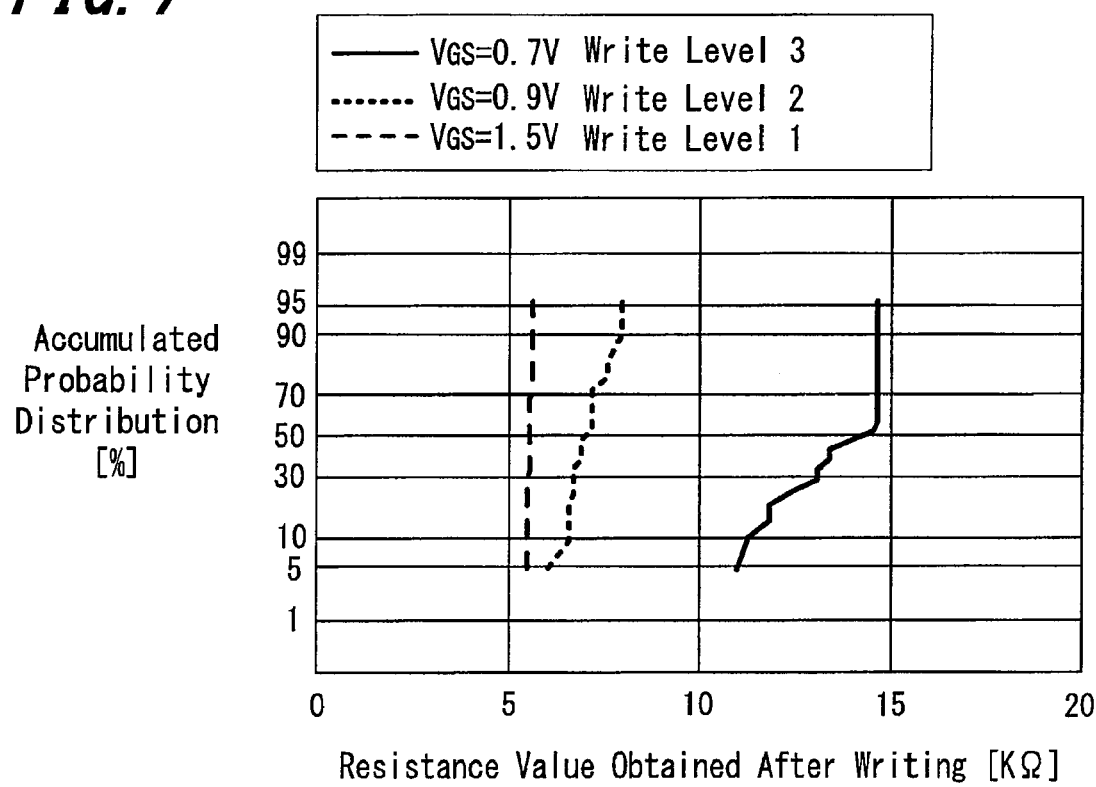
FIG. 7 is a diagram showing distributions of resistance values obtained from a written storage element after information has repeatedly been written and erased in the storage element.
Figure 8:
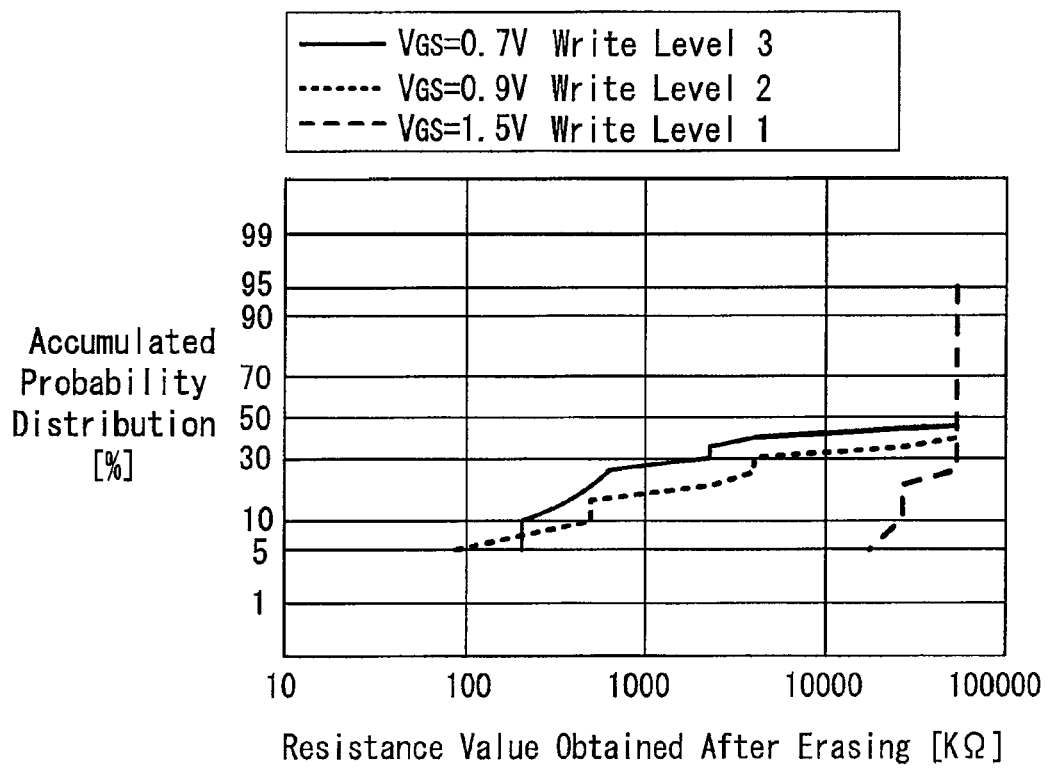
FIG. 8 is a diagram showing distributions of resistance values obtained after erasing from a written storage element after information has repeatedly been written and erased in the storage element.

FIGS. 7 and 8 show distributions of resistance values obtained after writing information in the storage element and distributions of resistance values obtained after erasing information from the storage element. In FIGS. 7 and 8, the horizontal axes represent resistance values obtained after writing information in the storage element and resistance values obtained after erasing information from the storage element and the vertical axes represent accumulated probability distributions [%]. In FIGS. 7 and 8, polygonal lines show variability of resistance values. The more perpendicular the polygonal line plots, the less variability may there be in the resistance values.

Of the three polygonal lines, solid-line polygonal lines represent distributions of the resistance values obtained when the level is changed between the write level 3 and the erase level per writing or erasing. Dotted-line polygonal lines represent distributions of resistance values obtained when the level is changed between the write level 2 and the erase level per writing or erasing. Broken-line polygonal lines represent distributions of resistance values obtained when the level is changed between the write level 1 and the erase level per writing or erasing. Of the solid-line polygonal lines, dotted-line polygonal lines and broken-line polygonal lines, the broken-line polygonal lines represent distributions of resistance values obtained when information is erased from the write level 1 having the lowest resistance value. Other two solid-line polygonal lines and dotted-line polygonal lines represent the case in which information is written without going through the lowest write level (write level 1).

As shown in FIG. 7, in the lowest write level 1, variability of resistance values is relatively small after repeatedly writing information one million times in the storage element. In contrast, in the write level 3, distributions of resistance values range from 11 k Ω to 14.5 k Ω. As clear from FIG. 8, when information is erased from the lowest write level 1, variability of the erase level is small. Variability of the erase level can be suppressed to approximately double digit-figure value. That is, when multi-valued recording is carried out, the level is not directly changed from the write level 2 to the erase level but the information is temporarily overwritten up to the lowest write level 1 and then erased.

It should be noted that the lowest write level (write level 1) indicates a condition where the gate voltage $V_{GS}$=1.5V (write level 1) in this example. However, the condition where the gate voltage $V_{GS}$=1.5 V may not always be the lowest write level. For example, a condition where the gate voltage $V_{GS}$=2.0 V may be the lowest write level.

While the MIS transistor T is connected in series to the storage element A to construct the memory cell C in the above-mentioned embodiments, the circuit element connected to the storage element in series is not limited to the MIS transistor. A bipolar transistor, for example, can be used as the circuit element connected in series to the storage element. Moreover, multi-valued recording may be carried out by changing a base current of the bipolar transistor or the applied voltage applied to both terminals of the memory cell. An active element and a resistance element such as a diode can be used as the circuit element connected to the storage element in series. When these diode and resistance element are used, multi-valued recording may be carried out by changing the voltage applied to both terminals of the memory cell. It should be noted that, when an active element such as a transistor and a diode is used as the circuit element connected in series to the storage element, the memory cell may be selected by the active element.

While the storage element A has the configuration having the I-V characteristics shown in FIG. 1 in the above-mentioned embodiments, the configuration of the storage element forming the memory cell is not limited to the storage element having the characteristics with similar properties in those of the I-V characteristics shown in FIG. 1 and can be widely used in general resistance change type storage elements.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory apparatus comprising:
   a storage element configured to store and retain information based on a state of an electric resistance; and
   a circuit element connected in series to the storage element as a load,
   wherein when writing is defined as an operation in which a state of the storage element having a high resistance value is changed into a state of the storage element having a low resistance value, and when erasing is defined as an operation in which a state of the storage element having a low resistance value is changed into a state of the storage element having a high resistance value, a resistance value obtained from the written storage element is set to one of a plurality of different levels by controlling a voltage or a current applied to the circuit element or the storage element upon the writing,
   wherein the storage element includes a plurality of levels having low resistance values and a plurality of levels having high resistance values obtained after erasing, to each of which different information is allocated, one of the respective storage elements of the memory cells may store information having a ternary value or more, wherein, when the information is erased from the plurality of levels having low resistance values excluding the level having the lowest resistance value, a level of the storage element is:

(a) initially changed to the level having the lowest resistance value; and (b) subsequently changed to the level having a higher resistance value; and wherein at least one of the levels having a low resistance value excluding the level having the lowest resistance value constantly passes the level having the lowest resistance value so erase characteristics can be constant.

2. The memory apparatus according to claim 1, wherein the circuit element includes a MIS transistor, access to the storage element from each the memory cell is controlled by the MIS transistor, and a resistance value obtained from the written storage element is set to one of the plurality of different levels by controlling a gate voltage applied to the gate element of the MIS transistor upon the writing.

3. The memory apparatus according to claim 1, wherein the circuit element includes a MIS transistor, access to the storage element from each the memory cell is controlled by the MIS transistor, and a resistance value obtained from the written storage element is set to one of the plurality of different levels by controlling a voltage or electric current applied to the source-drain of the MIS transistor or the storage element upon the writing.

4. The memory apparatus according to claim 2, wherein the gate voltage applied to the gate element of the MIS transistor is selected from different voltages.

5. The memory apparatus according to claim 3, wherein the voltage applied to the source-drain of the MIS transistor is selected from different voltages.

* * * * *